United States Patent [19]
Chisholm et al.

[11] 4,340,093
[45] Jul. 20, 1982

[54] METHOD OF STRAIGHTENING BACKPLANE-SUPPORTED PINS

[75] Inventors: William M. Chisholm, Midlothian; George S. Davis, Richmond; James C. Dougherty, Mechanicsville, all of Va.

[73] Assignee: Western Electric Co., Inc., New York, N.Y.

[21] Appl. No.: 124,677

[22] Filed: Feb. 26, 1980

[51] Int. Cl.³ ............................................... B21F 1/02
[52] U.S. Cl. ................................................... 140/147
[58] Field of Search ............... 140/147, 93 R; 29/755, 29/882

[56] References Cited

U.S. PATENT DOCUMENTS

| | | | |
|---|---|---|---|
| 3,603,357 | 9/1971 | Drummond | 140/147 |
| 3,700,011 | 10/1972 | Walter | 140/147 |
| 3,730,234 | 5/1973 | Hesselmann | 140/147 |
| 3,742,987 | 7/1973 | Tarbox et al. | 140/147 |
| 3,779,291 | 12/1973 | Yeo | 140/147 |
| 3,903,937 | 9/1975 | Drummond | 140/147 |

*Primary Examiner*—Eugene F. Desmond
*Attorney, Agent, or Firm*—J. B. Hoofnagle

[57] ABSTRACT

A plurality of pins (21) supported by a backplane (22) are initially processed through a straightening operation within a pin straightening apparatus (23) while using a preselected straightening amplitude. The centroids of a statistical sample of the pins (21) are then measured to obtain a measure of pin deviation from nominal. The measured data is then processed by a computer (48) to determine statistical values for mean deviation from nominal and standard deviation. Using the statistical values, a determination is made as to whether another straightening operation is required. If another operation is required, a modified straightening amplitude is determined by using the statistical values and is established within the pin straightening apparatus (23). The pins are then processed through the second straightening operation using the modified straightening amplitude.

9 Claims, 8 Drawing Figures

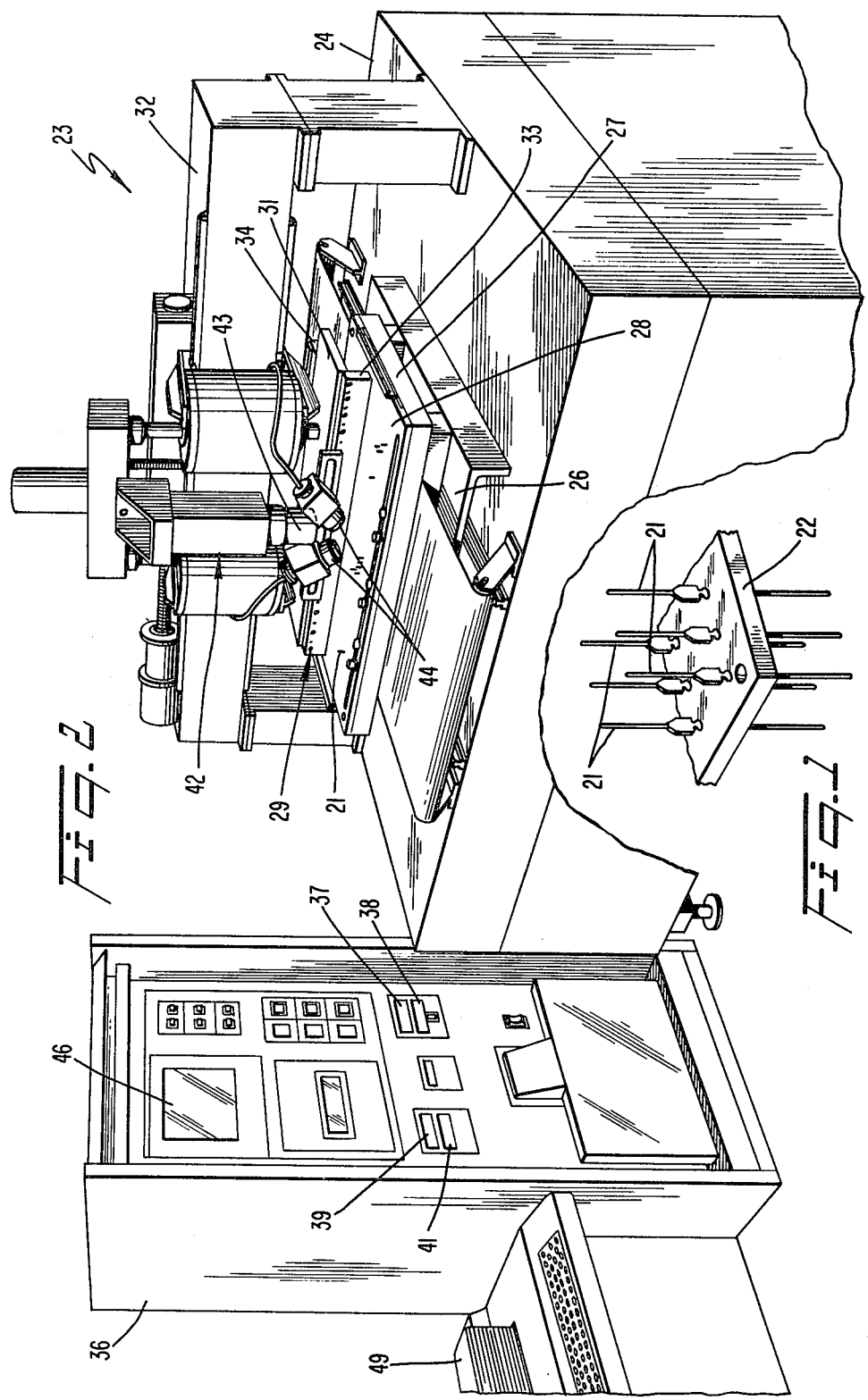

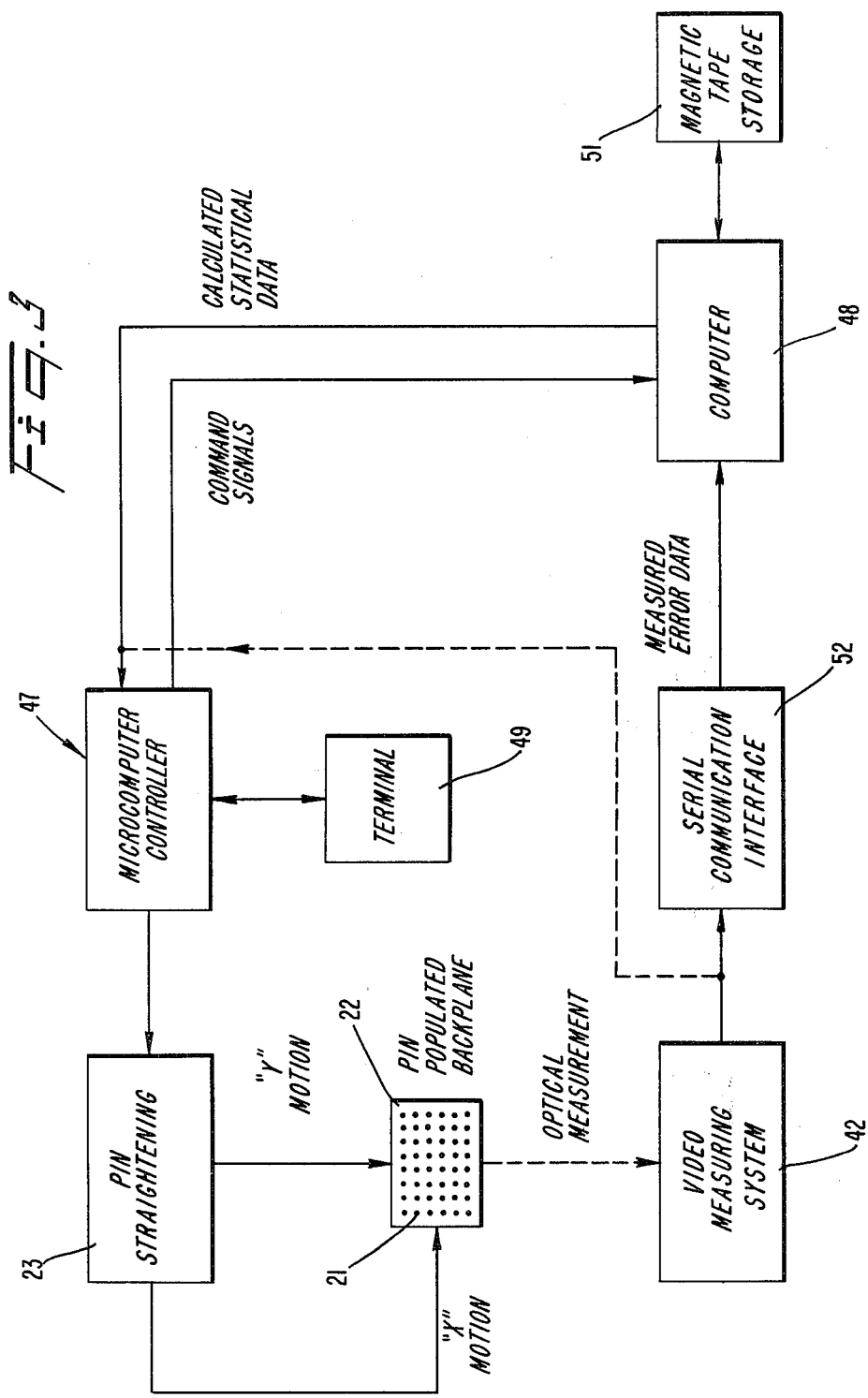

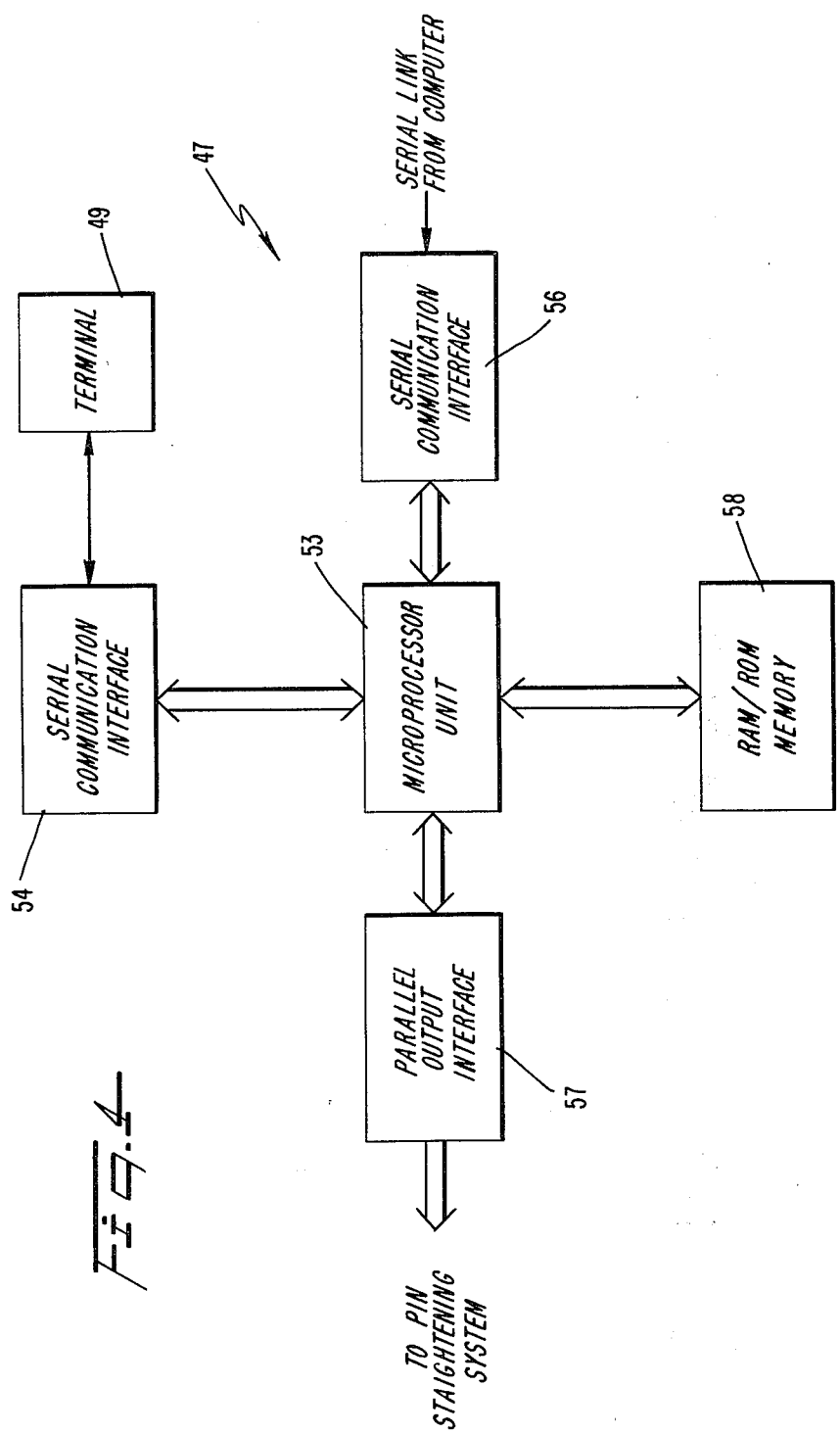

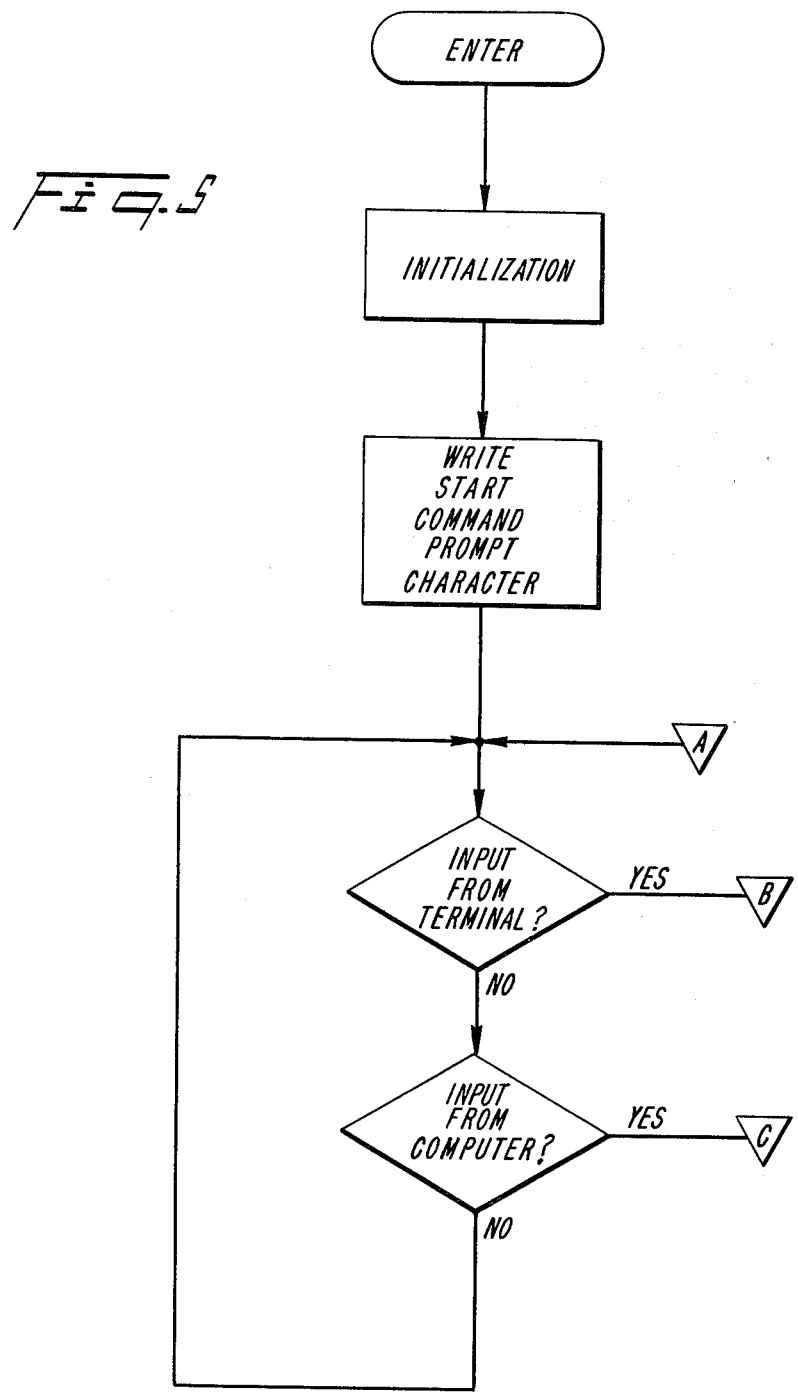

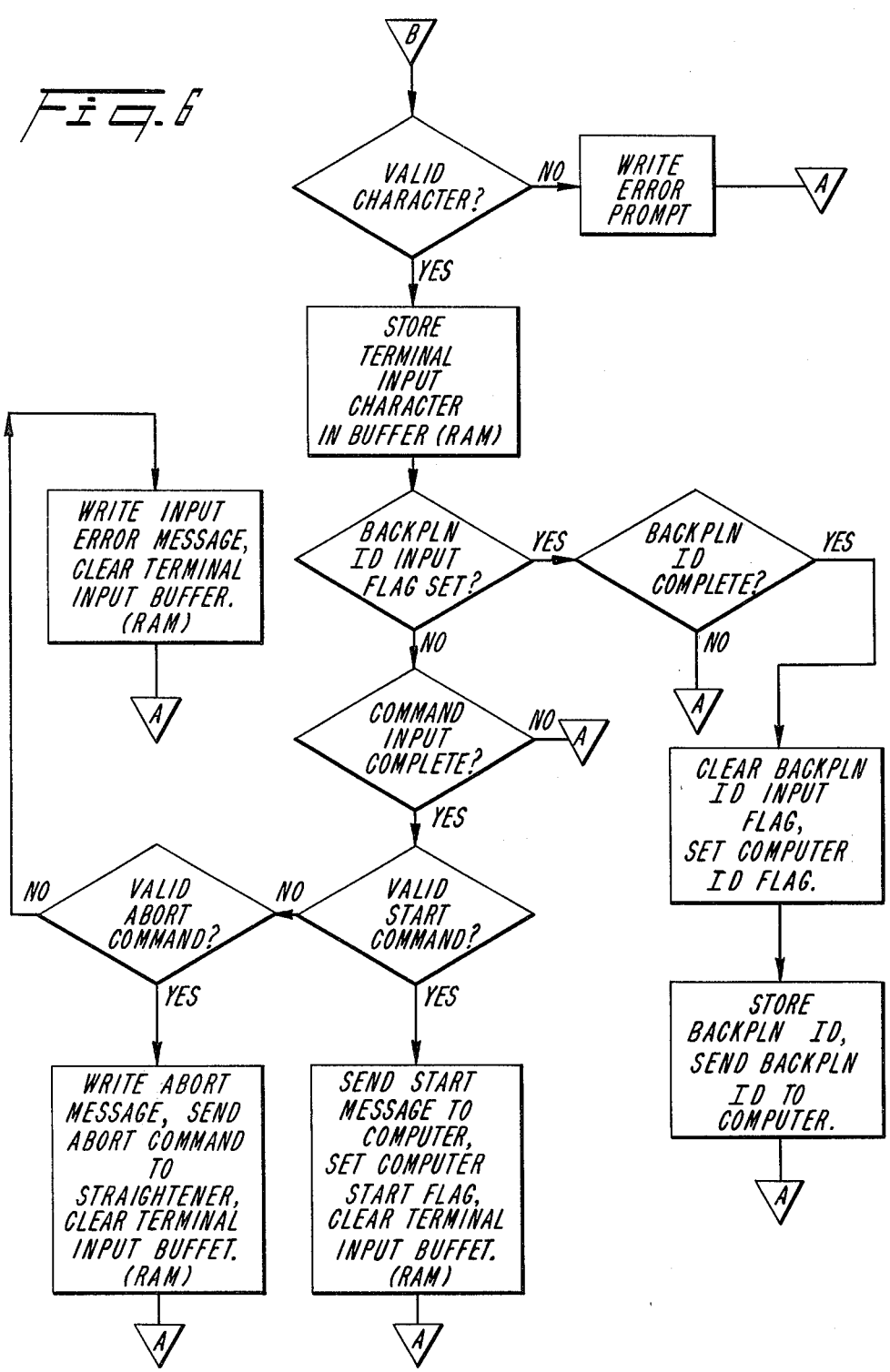

METHOD OF STRAIGHTENING BACKPLANE-SUPPORTED PINS

TECHNICAL FIELD

This invention relates to methods of and apparatus for straightening pins supported in a backplane. This invention particularly relates to methods of processing pins through first and second straightening operations with a second straightening amplitude being automatically selected on the basis of measured statistical mean of pin deviation after the first operation.

BACKGROUND OF THE INVENTION

In the manufacture of some types of rigid pin-populated printed wiring boards, as many as 10,000 terminal pins are inserted into apertures of each of the boards. The boards are referred to as backplanes and typically measure eight inches by twenty-two inches on their sides. The pins electrically engage portions of printed wiring on the backplanes to provide for connections to external circuits. Typically, the spacing between adjacent apertures on each backplane is extremely small. For example, the spacing between apertures on one backplane is 0.125 inch. Further, each terminal pin typically has a square cross section of, for example, 0.025 inch except in those areas where the pin is formed with (1) lateral ears having a push shoulder and (2) an aperture-engaging portion intermediate the ends thereof. The pin is relatively slender and typically measures one and one-half inches in length.

Each of the pins have slender shank portions which extend from opposite sides of the backplane. After the pins have been assembled with the backplane, the backplane is mounted in a frame where external wiring is wire wrapped to the pins on one side of the backplane commonly referred to as the wiring side. Other printed wiring boards, referred to as circuit packs, have electronic components electrically and mechanically secured thereto and have connectors secured to one end thereof. The connectors of these boards ultimately are inserted over selected ones of the pins extending from the other side of the backplane commonly referred to as the component side.

During the insertion of the pins into the apertures of the backplane and during subsequent handling of the pin-populated backplane, some of the pins may be bent undesirably. For example, the most severely bent pins may deviate from an axial centerline by 0.050 inch in any direction. Consequently, adjacent pins which are bent in opposite directions could have a deviation swing of 0.100 inch.

Since the component side of the pins are destined for insertion into a connector, and the pins on the wiring side may be wired by an automatic wiring facility, it is important that the pins be axially straight and perpendicular to the plane of the backplane within an acceptable tolerance. Otherwise, a slightly bent pin on the component side, for example, could be misaligned with its mating aperture in the connector. As the connector is moved into place, the bent pin would engage the face of the connector and would be bent further towards the surface of the backplane thereby failing to provide the required electrical connection.

Since the pins are located on a grid spacing of 0.125 inch, and since the pins have a square cross section of 0.025 inch, the facing portions of adjacent pins are 0.100 inch apart. Consequently, it is most difficult to provide a facility for straightening pins which are so closely arranged. For example, a straightening facility typically is positioned over the tip of the pin to be straightened and is then moved in a selected motion whereby the walls of the opening engage and move the pin close to the centerline of the opening. To accomplish this straightening operation, a pin-receiving opening of the facility must be slightly larger in cross section than the cross section of the pin. Further, to insure that a bent pin will enter the pin-receiving opening, the mouth of the opening should be formed with a tapered or conical lead-in portion of sufficient dimension to receive any pin having a deviation as severe as 0.050 inch. Thus, the conical lead-in portion of the opening would require additional space in the cross section direction. In addition, the facility must have some bulk around the pin-receiving opening to provide for the opening and the conical lead-in portion. Thus, it is apparent that, with the close spacing between adjacent pins, it is most difficult to provide a sturdy facility which can accomplish the straightening of the pin.

Still another problem encountered in straightening the pins is due to warpage of the backplane after the pins have been inserted into the backplane. Such warpage is due to the pin density and the interfacial relationship between the apertures and the pins. Consequently, while any pin may be perpendicular with the backplane, if the backplane is warped, the tip of the pin would appear to be bent. This would provide indication that the pin requires straightening even though the pin is perpendicular with the portion of the backplane surrounding the aperture into which the pin is mounted.

As noted above, as many as 10,000 pins are typically inserted into apertures of a single backplane. In a typical manufacturing operation, many pin-populated backplanes are assembled within relatively short periods of time. For example, in one manufacturing operation, 160 pin-populated backplanes can be assembled within a single day. Since each pin on the component side of each backplane must be straightened, and since there is such a large number of pins to be straightened, efficiency dictates that pluralities of pins be straightened simultaneously. However, when such mass pin straightening is considered, the above-mentioned problems resulting from the closeness of adjacent pins and warpage of the backplane pose serious difficulties.

Since the shanks of the pins are slender, it is important that the straightening forces not be excessive to the extent that the pins are damaged. Additionally, during the pin straightening operation, the portions of the pins which are mounted within apertures of the backplane must not move laterally. Otherwise, lateral movement of the pins within the apertures could result in damage to the backplane. Lateral pin movement within the apertures can occur when the backplane is permitted to move during the pin straightening operation. Thus, it is important that the backplane be rigidly secured to a fixture to prevent any of the straightening motion from being transmitted to the backplane. Further, it is important that the pins to be straightened be visible immediately before the assembly of the straightening facilities with the pins. If the pins are inserted into an enclosure, wherein the pins are not visible, and are then inserted into a straightening facility, there is no way to determine whether any of the pins were bent considerably beyond a position of assembly with the facility. In this instance, the bent pins could be deformed against the backplane by the straightening facility. If a straightening operation is then conducted, the backplane and other pins could be damaged.

An apparatus which holds the backplane flat in a rigid mounting with the pins visible and which applies relatively nonexcessive straightening forces to the pins is disclosed in a copending application filed on even date herewith in the name of W. M. Chisholm. The aforementioned application of W. M. Chisholm has been assigned Ser. No. 124662 by the U.S. Patent and Trademark Office. The disclosure of the above-mentioned application, Ser. No. 124662, filed on even date herewith is incorporated herein by reference thereto. The disclosure of copending application filed on even date herewith in the names of W. M. Chisholm and J. C. Dougherty and assigned Ser. No. 124683 by the U.S. Patent and Trademark Office, is also incorporated herein by reference thereto. Both of the aforementioned applications, Ser. Nos. 124662 and 124683, are assigned to the assignee of record in this application.

To insure that the pins are accurately straightened within acceptable tolerances, the pins should be examined after a straightening operation to determine whether further processing of the pins is required. Thus, it is important that the pins remain visible after the straightening operation to permit observation thereof. Further, there is a need for a process to measure and obtain data regarding the condition of the pins after a first straightening operation and to use the data to provide indication regarding the need for a second straightening operation and alterations to the straightening amplitude used in the first operation.

SUMMARY OF THE INVENTION

In a method of straightening pins supported in a backplane, in accordance with certain principles of the invention, a straightening amplitude for processing the pins in a straightening operation is selected and the pins are then processed through a first straightening operation in accordance with the selected straightening amplitude. Thereafter, the centroids of a statistical sample of the pins are measured to obtain a measure of pin deviation from nominal after the first straightening operation. Using the measured data, a mean deviation from nominal is calculated and an automatic adjustment is made to the straightening amplitude based on the calculated mean deviation. Thereafter, the pins are processed through a second straightening operation following the adjustment to the amplitude to straighten the pins within acceptable tolerances.

BRIEF DESCRIPTION OF THE DRAWINGS

FIG. 1 is a perspective view of a plurality of pins supported in a backplane;

FIG. 2 is a perspective view showing a pin straightening apparatus, a video measuring system and a send/receive terminal used in accordance with certain principles of the invention;

FIG. 3 is a block diagram of a system including the elements of FIG. 2, a microcomputer controller, a computer and a terminal arranged for use in accordance with certain principles of the invention;

FIG. 4 is a block diagram showing the microcomputer controller of FIG. 3; and

FIGS. 5 through 8 show flow charts for calculating mean values for pin deviation from nominal within the computer of FIG. 3 and for processing data from the computer and the terminal all in accordance with certain principles of the invention.

DETAILED DESCRIPTION

Figure 7:
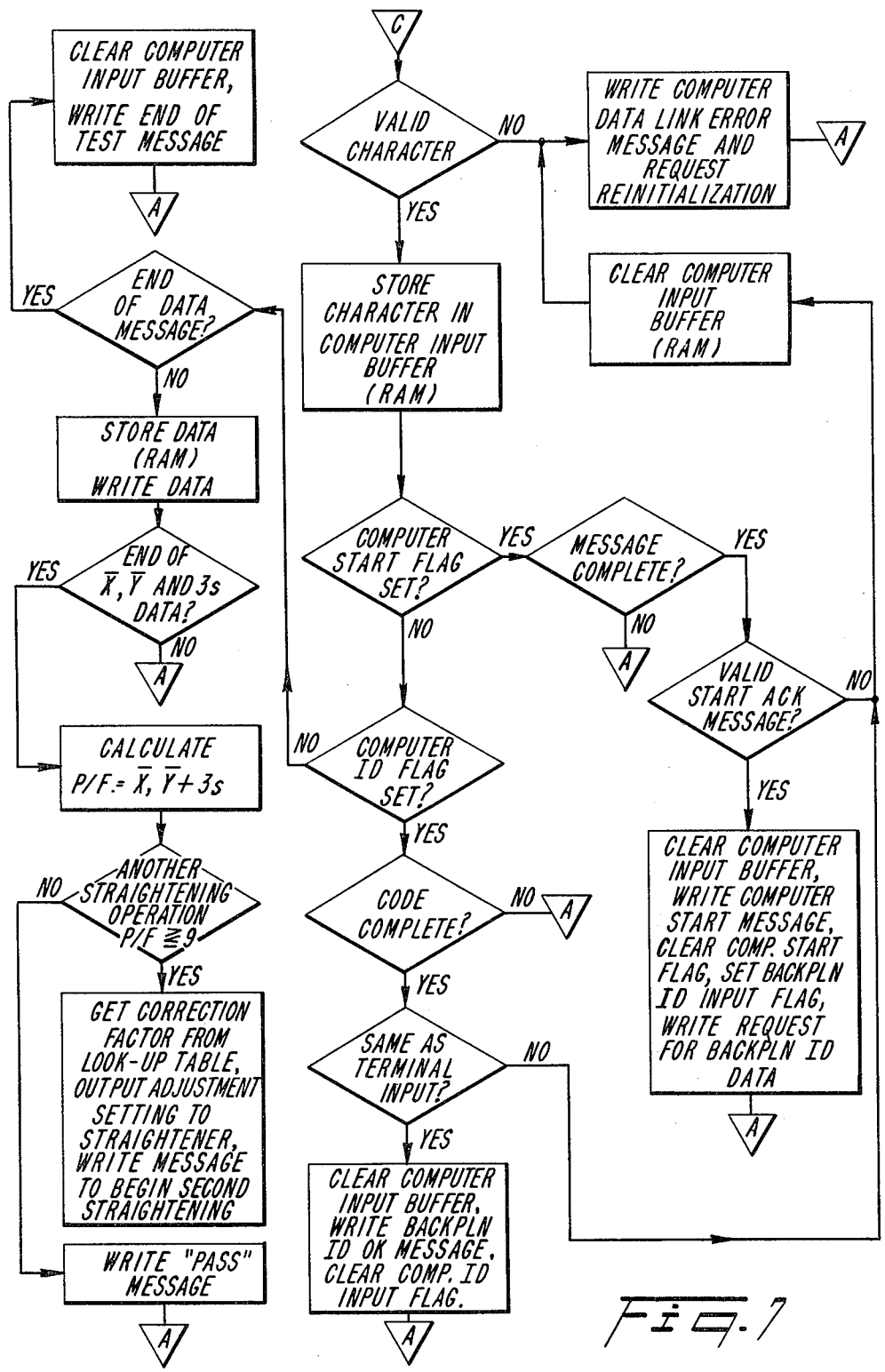

Referring to FIG. 1, a plurality of pins 21 are supported in a backplane 22. The pins 21 are arranged on a grid spacing of 0.125 inch and are one and one-half inches in length. The backplane 22 typically measures eight inches by twenty-two inches and is formed with apertures to support as many as 10,000 pins. The shanks of the pins 21 are square and have a side dimension of 0.025 inch.

As noted above and in the aforementioned application of W. M. Chisholm,. Ser. No. 124662, it is significantly important that the pins 21 be perpendicular, within acceptable tolerances, to the backplane 22. Referring to FIG. 2 a pin straightening apparatus, designated generally by the numeral 23, includes facility for processing the pins 21 through a pin straightening operation. The pin straightening apparatus 23 is also described in the aforementioned application of W. M. Chisholm.

The apparatus includes a table 24 which supports a platform 26 for horizontal movement between the front and rear of the table. A fixture 27 is mounted to the top of the platform 26 and provides support for the backplane 22 with the pins 21 extending upwardly therefrom. A clamping cover 28 is positionable on the fixture 27 and can be clamped thereto to capture rigidly the backplane 22 therebetween with the tips of the pins 21 extending upwardly through apertures in the cover. The cover 28 also flattens the backplane 22 against the fixture 27.

A pin straightening assembly, designated generally by the numeral 29, is attached to a vertically movable holding bar 31 which is suspended from a cross arm 32 above the table 24. The holding bar 31 is also movable horizontally between the sides of the table in the plane of the holding bar. The pin straightening assembly 29 includes a bar 33 for straightening the pins 21 in the plane of the bar which is referred to as the "X" direction. The assembly 29 also includes a plurality of spaced bars 34 which are horizontal and perpendicular to the bar 33 and which extend toward the rear of the table 24. The spaced bars 34 cooperate with the fixture 27 to straighten the pins 21 in the plane of the fixture which is referred to as the "Y" direction. Each of the bars 33 and 34 are formed with apertures which are positioned over the tips of the pins 21 to capture the pins. When the bars 33 and the fixture 27 are reciprocated, or wiggled, opposite walls of each aperture alternately engage the captured pin 21 and work the pin to and fro in a straightening process. Consequently, the distance that the bar 33 and the fixture 27 travel in each direction is important.

The apparatus 23, excluding the fixture 27, the clamping cover 28 and the pin straightening assembly 29, is a commercially available system from Ambrit, Inc. of Wilmington, Massachusetts as their Model No. 218. The system from Ambrit, Inc. also includes a control system, contained within a housing 36 for establishing the control for moving the platform 26 and the holding bar 31 as required. The control system can be adjusted manually to establish straightening amplitude limits by adjusting thumbwheel switches 37 and 38 for the positive and negative settings, respectively, in the "X" direction and thumbwheel switches 39 and 41 for the positive and negative settings, respectively, in the "Y" direction.

Also, external signals could be fed to the control system to automatically adjust the straightening amplitude limits.

Assume that a plurality of pins 21 have to be processed through a straightening operation in the "X" direction. Historically, it has been shown that pins 21 can deviate as much as 0.050 inch from nominal due to insertion of the pins into the backplane 22 and due to subsequent handling. Taking this into account and as a starting point, the thumbwheel switches 37 and 38 are adjusted to provide for a straightening amplitude of 0.120 inch in the positive "X" direction and 0.075 inch in the negative "X" direction. The bar 33 is wiggled with this straightening amplitude and the pins 21 are worked through the straightening process in an effort to bring the pins into a straightness condition within acceptable tolerance limits. The same procedure would be followed for processing the pins 21 through a straightening operation in the "Y" direction.

After the pins 21 have been processed through a first straightening operation, a video measuring system, designated generally by the numeral 42, measures the centroids of a randomly selected number of the pins 21 which represent a statistical sample of the total number of pins. The video measurements are taken with respect to a datum reference point on the fixture 27 which also serves to insure proper alignment of the backplane 22 with the fixture and the bar assembly 29. The video measuring system 42 includes a vidicon camera 43 and two lamps 44 which are mounted to the apparatus 23 for vertical and horizontal movement with the holding bar 31. The lamps 44 direct light toward the tips of the pins 21. The camera 43 is positionable to be focused in the plane of the tips of the pins 21. The camera 43 and the lamps 44 are moved vertically to a pin monitoring position under control of the control system for the apparatus 23. The apparatus 23 then moves the camera 43 to a preselected number of random positions in a horizontal plane. At each position, the camera 43 senses the light reflective surface of the square cross section of the tip of the pin 21 and determines the location of the centroid of the pin relative to a video system X-Y cross hair. The image of the sensed pin 21 is projected onto a display tube 46 which is mounted in the housing 36. The image is displayed for operator observation relative to an C-Y cross hair displayed on the tube 46. In addition, the display on the tube 46 is established for subsequent digitizing by a video processor within the housing 36.

The video processor includes electonic circuits which breaks up the optical field of view into a two dimensional matrix comprising approximately five-hundred by five-hundred square elements referred to as pixels. Pixels are digitized according to their degree of brightness. Measurements are made by electronically counting the number of pixels between transitions from dark-to-light or light-to-dark edges. The counted number is then multiplied by a calibration factor that has previously determined the dimensional value of a pixel. Based on the measurements of the pin centroids obtained through the video measuring system 42, the video processor develops an output in parallel word form which represents the deviation of each measured pin from nominal.

The video measuring system 42 as described above, and including the video processor, is available from View Engineering, Inc. of Chatsworth, Calif. as their Video Processor RB-1.

Referring to FIG. 3, a block diagram schematic shows the pin straightening apparatus 23 for controlling the "X" direction motion and the "Y" direction motion of the backplane 22 and the pins 21.

Referring further to FIG. 3, a microcomputer controller, designated generally by the numeral 47, is connected to a computer 48 and to a send/receive terminal 49. The computer 48 is connected to a magnetic tape storage 51. The operator uses the terminal 49 to communicate with the controller 47, and indirectly with the computer 48, during a preparation period before initiating the first straightening operation. During this period, the identification code of the backplane 22 is supplied by the operator to the controller 47 and the computer 48 and the computer is placed in a mode to receive information from the video measuring system 42. The operator is then instructed to initiate operation of the pin straightening apparatus 23.

The computer 48 is a Honeywell 735 commercially available from Honeywell Information Systems, Inc. of Waltham, Massachusetts. The terminal 49 is a DIGITAL DEC-WRITER II commercially available from Digital Equipment Corporation of Maynard, Mass.

After the first straightening operation, the video measuring system 42 measures the deviation of the centroids of the randomly selected pins 21 which have been previously processed through a straightening operation. The parallel word data from the video measuring system 42 is converted to a serial data stream by a serial communication interface 52 which is an asynchronous communication interface adapter identified as MC6850 from Motorola Semiconductor Products, Inc. of Phoenix, Ariz. The parallel word output of the video measuring system 42 must be converted to a serial data stream so that it is compatible with the computer 48.

The computer 48 receives the serial data stream from the interface 52 and performs calculations to determine the arithmetic mean deviation from nominal in the "X" and "Y" directions for all the pins 21 which were measured. The mean deviation from nominal for all of the sampled pins 21 in the "X" direction is referred to as $\overline{X}$ and for all the sampled pins in the "Y" direction is referred to as $\overline{Y}$. In addition, the computer 48 calculates the standard deviation of the random sample lot. The symbol for the standard deviation is "s". The standard deviation (s) represents a statistical deviation of all of the pins 21 based on calculations using data derived from measuring the deviation of the randomly selected pins. The standard deviation (s) is a statistical measure of pin deviation swing on either side of the mean deviation $(\overline{X},\overline{Y})$ and follows a bell curve with the $\overline{X}$ or $\overline{Y}$ reading being in the center of the curve. For example, statistical analysis reveals that, for a range of deviation which equals $\overline{X}$ plus or minus "s", $(\overline{X}\pm s)$, about seventy percent of all pins 21 on the backplane 22 will fall within this range of deviation. For a range of deviation which equals $\overline{X}$ plus or minus three times "s", $(\overline{X}\pm 3s)$, over ninety-nine percent of all pins will fall within this range. Thus, by comparing the latter range $(\overline{X}\pm 3s)$ with acceptable tolerance limits, a statistical determination can be made regarding straightness acceptability of essentially all of the pins. Statistically, then, this permits a high degree of confidence in deviation observation for all pins based on the deviation measurements of a relatively small percentage of the total number of pins.

After the calculations have been completed by the computer 48, the $\overline{X}$, $\overline{Y}$ and "s" data message are forwarded to the controller 47. The controller 47 then uses the forwarded data to determine whether a second straightening operation is required. If a second straightening operation is required, the controller 47 determines what adjustments are to be made to the straightening amplitude. Thereafter, a message is forwarded to the pin straightening apparatus 23 from the controller 47 to automatically adjust the straightening amplitude. The controller 47 then provides instructions on the terminal 49 to the operator to initiate a second or corrective straightening operation. Due to concern for human safety, the second straightening operation is not started automatically by the controller 47.

Statistically, it has been determined that at least two straightening operations are usually required to straighten the pins 21 within an acceptable tolerance. Consequently, the apparatus 23 may be controlled through programming of the controller 47 and the computer 48 to bypass the step of determining whether a second straightening operation is required. Under this option, a standard pin straightening amplitude is established between spaced values having opposite end limit settings. The end limit settings are selected from a scale of values which set the limits between which the pin straightening assembly 29 travels within the apparatus 23. These settings are established by adjustment of thumbwheel switches 37 and 38 as described hereinabove. In addition, a table of values is developed which represents selectable adjustment settings for at least one of the end limit settings where the values of the table are based on (1) a range of mean deviations from nominal of a statistical sample of the pins and (2) the end limit setting. Thereafter, the pins 21 are processed through a first pin straightening operation using the standard pin straightening amplitude as described hereinabove. The centroids of a statistical sample of the pins 21 are then measured to obtain measured data representing pin deviation from nominal in the manner described above by use of the video measuring system 42. The measured data is then used by computer 48 to calculate a mean deviation from nominal which is forwarded to the controller 47, also as described hereinabove.

Based on the calculated mean deviation, the controller 47 reviews the table of values and an adjustment value is selected therefrom. A message is then forwarded to the pin straightening apparatus 23 by the controller 47 to automatically adjust the straightening amplitude in accordance with the selected adjustment value. The controller 47 then provides instructions on the terminal 49 to the operator to initiate a second pin straightening operation using the adjusted amplitude.

Thus, two pin straightening operations are purposely conducted with intermediate steps to determine and make an adjustment to the straightening amplitude prior to conducting the second operation. This permits a user of the apparatus 23 to process the pins 21 through two pin straightening operations without having to determine whether a second operation is needed.

Referring to FIG. 4, the controller 47 includes a microprocessor unit 53 which is of the type identified as a MC6802 available from Motorola Semiconductor Products, Inc. of Phoenix, Ariz. The microprocessor unit 53 is connected to a first serial communication interface 54 and a second serial communication interface 56. The microprocessor unit 53 is also connected to a parallel output interface 57. Each of the interfaces 54 and 56 is an asynchronous communication interface adapter identified as MC6850 while interface 57 is a peripheral interface adapter identified as a MC6821.

The MC6821 and the MC6850 are available from Motorola Semiconductor Products, Inc. of Phoenix, Ariz. The microprocessor unit 53 is also connected to a memory 58 composed of a ROM and a RAM. The interface 54 is connected to the terminal 48. The interface 56 is connected to the computer 48. The interface 57 is connected to the pin straightening apparatus 23.

Referring to FIGS. 5 through 8, the flow charts illustrated therein reveal the procedure for the above-described operation. Initially, an operator closes a power-on switch which starts the procedure at "ENTER" in FIG. 5. Thereafter, in an initialization procedure, the various internal systems within the controller 47 are prepared for processing data. The controller 47 then indicates the operator, by use of the terminal 49, that the system of the controller is ready and a start command may now be issued.

By use of the terminal 49, the operator enters a selected combination of characters representing a start command to the controller 47. This command enters a scanning loop in FIG. 5 and appears as an input from the terminal 49. Referring to FIG. 6, each character of the start command is examined to determine whether it is a valid character. If it is not, a message to that effect is printed at the terminal 49 and the system returns to the scanning loop of FIG. 5 awaiting the next input.

If the character is valid, it is stored in the RAM of the memory 58. Each character is then examined to determine whether the start input is complete. If it is not, the system returns to the scanning loop of FIG. 5 awaiting the next character. If the start command is complete, it is examined to determine whether it is a valid start command, a valid abort command or some error input. If it is a valid start command, a start message is sent to the computer 48, a computer start flag (FIG. 7) is set and the RAM is cleared of all data relating to the start command.

During operation of the various portions of the entire pin straightening system, there may be a need to abort the operation. The operator can enter an abort command which follows the same procedure as a start command to the point where it is determined that it is a valid abort command. At that time, an abort message is printed at the terminal 49. Also, an abort command is forwarded to the pin straightening apparatus 23 to cease opertions. Further, the RAM is cleared of all data relating to the abort command.

If the input had been an error, a message would appear at the terminal 49 indicating the error and the error data would be cleared from the RAM.

When the start message is received by the computer 48 (FIG. 8), an initialization process beings whereby the various internal systems within the computer are prepared for the processing of data. The computer 48 then sends a message informing the controller 47 that the computer is ready to start operation. Each character of the message from the computer 48 enters the scanning loop of FIG. 5 and is processed for a valid character examination in FIG. 7. If any of the characters are not valid, an error message appears on the terminal 49 indicating that a character from the computer is in error. A request also appears at the terminal 49 instructing the operator to institute a reinitialization procedure to prepare its internal systems for a restart of the processing of data. This would also include a reinitialization of the computer 48.

If the character is valid, it is stored in the RAM of memory 58 and then held until the message is complete.

Once the complete message has been received by the controller 47, it is examined to determine whether it is valid. If it is not valid, a message appears at the terminal 49 to that effect and the operator is instructed to start a process of reinitialization of the controller 47 and, thereby, the computer 48.

If the message is valid, the RAM is cleared of all data associated with the message. A message appears at the terminal 49 indicating that the computer 48 is in the start mode and that the identification code for the backplane is requested. The computer start flag (FIG. 7) is cleared and a flag for the identification code of the backplane is set. Also a request for the identification code appears at the terminal 49.

The operator then addresses the controller 47 through the terminal 49 and supplies the identification code of the backplane, the time and the date. Each character of this data enters the scanning loop (FIG. 5) and is processed to determine whether the character is valid (FIG. 6). If it is not, an error message appears at the terminal 49. If it is a valid character, it is stored in the RAM. When it is a complete message, the flag for the identification code is cleared and the computer identification code flag (FIG. 7) is set. Also, the identification code, time and date is stored in the RAM and is sent to the computer 48.

When the identification code is received by the computer 48, it is stored therein and the computer can now label or title a file storage within the computer for later-accepted data associated with this backplane. Also, the computer 48 sends the same data back to the controller 47 where it enters the scanning loop (FIG. 5). Each character of this return data is then examined to determine its validity. If it is not valid, a message to that effect appears at the terminal 49. Also, the operator is instructed to reinitialize the controller 47 and, thereby, the computer 48. If it is a valid character, it is stored in the RAM until the completed data is received. It is then compared with the identification code, time and date which was originally entered at the terminal 49. If the computer data is not the same, the RAM is cleared, a message to this effect appears at the terminal 49. Also, the operator is instructed to reinitialize the controller 47 and, thereby, the computer 48.

If the computer data is the same as the original terminal data, the RAM is cleared of this data, a message appears at terminal 49 indicating that the computer data is acceptable and the computer identification code flag is cleared. Also, a message to the operator appears at the terminal 49 instructing that the operator initiate the first straightening operation by depressing a start switch associated with the pin straightening apparatus 23.

It is noted that during the straightening operation, the computer 48 remains in the mode to receive data from the video measuring system 42.

Figure 8:
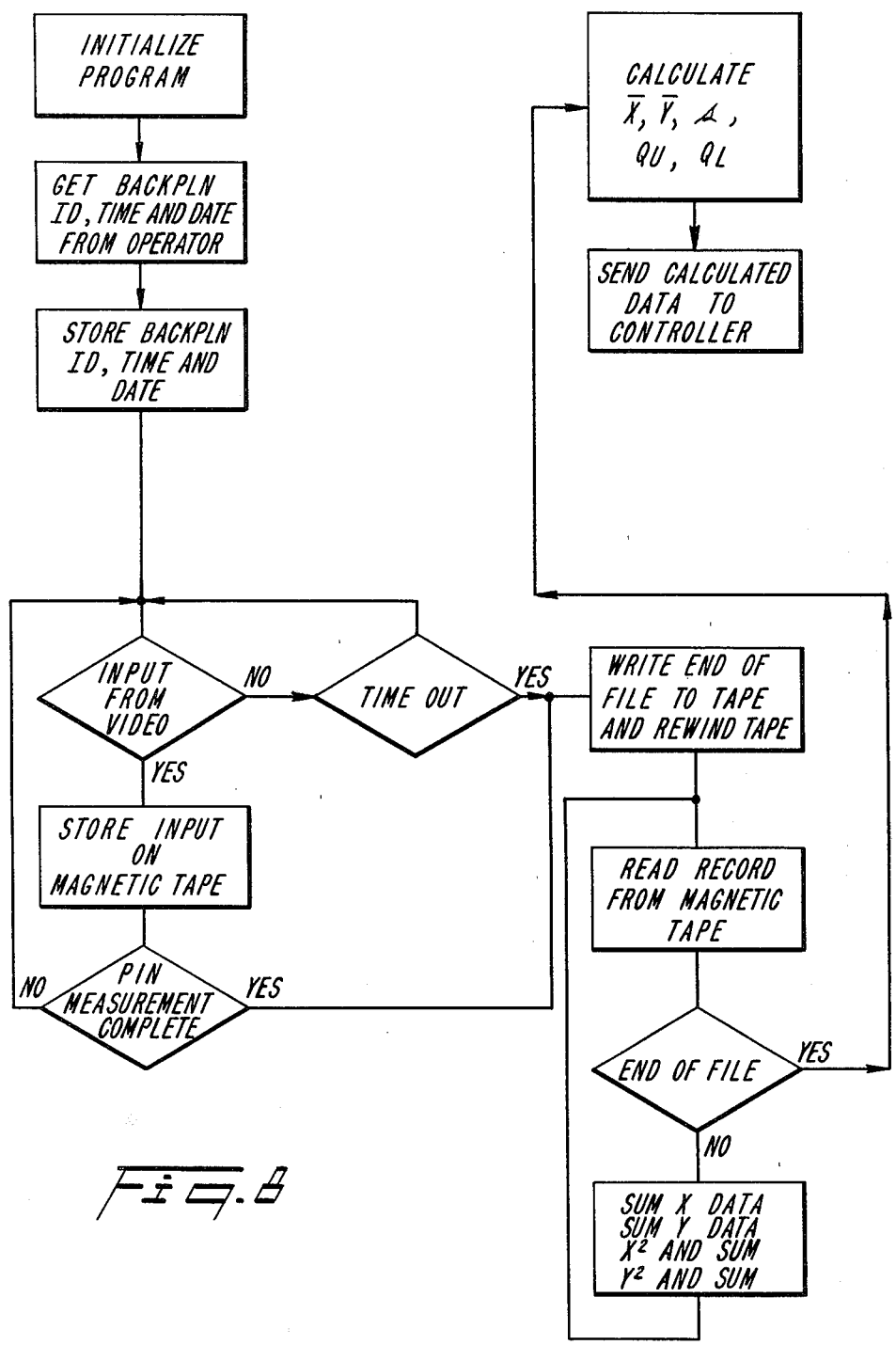

Eventually, the pin straightening operation is completed and the video measuring system 42 automatically proceeds to begin the video measuring operation. Ultimately, the "X" and "Y" deviation data enters the computer 48. Referring to FIG. 8, if the signals entering the computer 48 are not the video processed data, the decision from the "INPUT" box is "no." The "TIME OUT" decision box only answers "yes" after a preset period of time has lapsed with no input data to the computer 48. This could indicate the end of the video measuring procedure. If data signals enter the computer 48, the "TIME OUT" box responds with a "no" which then loops back to the "INPUT" awaiting the next piece of data. When data enters the computer 48, the "INPUT" decision is "yes" and the data representing "X" and "Y" deviations from nominal is stored on magnetic tape. After each piece of data is received and stored, the "TEST COMPLETE" question is asked. If the complete file of data, representing all data from the video measuring operation, has not been received, the process then loops back to the "INPUT" awaiting the next piece of input data.

Ultimately, when all data has been received by the computer 48, the decision from the "TIME OUT" or "TEST COMPLETE" is "yes." The computer 48 now writes on the magnetic tape that this is the end of file and rewinds the tape to the start point because this is a sequential tape. The computer 48 now reads the record from the magnetic tape and serially sums in a counter the "X" deviation data, the "Y" deviation data, "$X^2$" deviation data and "$Y^2$" deviation data. In addition, a count is added to the counter for each "X" reading and each "Y" reading representing the number of pins measured. When the end of file is reached on the magnetic tape, the computer 48 begins a series of calculations using the summed data in the counter.

The calculations are based on procedures set forth in a Military Standard publication identified as MIL-STD-414, issued on June 11, 1957 with specific reference to pages 41, 42 and 43. Based on the procedures in MIL-STD-414, the following equations were used to make calculations for the "X" measurement data such as $\overline{X}$, s, an upper quality index ($Q_U$), a lower quality limit ($Q_L$) and $\overline{X}$ plus 3s. The same equations would be used for the "Y" measurement data.

(1) Number of pins measured: n
(2) Sum of measurements: $\Sigma X = X_1 + X_2 + \ldots X_n$
(3) Sum of Squared Measurements: $\Sigma X^2 = X_1^2 + X_2^2 + \ldots X_n^2$.

The summations under (2) and (3) above are accomplished in the counter as noted hereinabove.

(4) Correction Factor (CR): $CF = (\rho X)^2/n$
(5) Corrected Sum of Squares (SS): $SS = \Sigma X^2 - CF$
(6) Variance (V): $V = SS/(n-1)$
(7) Standard Deviation (s): $s = \sqrt{V}$
(8) Sample Mean ($\overline{X}$): $\overline{X} = \Sigma X/n$
(9) Quality Index, Upper ($Q_U$): $Q_U = (9 - \overline{X})/s$
(10) Quality Index, Lower ($Q_L$): $Q_L = (\overline{X} - 9)/s$ The "9" used in equations (9) and (10) represents a pin deviation tolerance of plus or minus 0.009 inch.

Eventually, all of the calculations have been completed and data representing $\overline{X}$, $\overline{Y}$ and 3s are coupled from the computer 48 to the controller 47. The data enters the scanning loop (FIG. 5) and is processed for a valid character examination (FIG. 7). If it is not a valid character, a message appears on the terminal 49 to indicate an error and to instruct the operator to reinitialize the controller 47 and, thereby, the computer 48. If a valid character is received, it is stored in a first location within the RAM and analyzed to determine whether it is end of message data. If it is not end of message data, it is stored in a second location within the RAM as $\overline{X}$, $\overline{Y}$ and 3s. In addition, the same data is displayed at the terminal 49. After the $\overline{X}$, $\overline{Y}$ and 3s data has been forwarded by the computer 48, the computer then forwards an end of data message to the controller 47. When the end of data message is received, the $\overline{X}$, $\overline{Y}$ and 3s data is cleared from the first location of the RAM where it was originally stored. It is noted that the $\overline{X}$, $\overline{Y}$ and 3s data continues to be stored in the second location of the RAM. Also an end of data message appears at the terminal 49. A calculation is then made within the controller 47 using the received data to derive a factor as a measure of whether or not the pins 21 fall within an acceptable deviation tolerance limit. This factor is referred to as a Pass/Fail factor (P/F) and is determined by the following equation:

$$P/F = \overline{X} \pm 3g$$

P/F is then compared with a tolerance limit of 0.009 inch to determine whether another straightening operation is required. If P/F is less than or equal to the tolerance limit, a "pass" message is displayed at the terminal 49 to indicate that a second straightening operation is not required.

If P/F is greater than the tolerance limit, another straightening is required. Based on the $\overline{X}$ and $\overline{Y}$ readings, a correction factor is selected from a look-up table stored in the ROM of the memory 58. The look-up table provides a factor for adjusting the straightening amplitude used in the initial straightening operation to provide a straightening amplitude which will bring the pins 21 within the tolerance limits. The amplitude adjustment data is coupled to the pin straightening apparatus 23 to automatically adjust the straightening amplitude. A message is then placed on the terminal 49 which instructs the operator to initiate the second straightening process of the same pins 21. The operator then closes the start switch and the second straightening operation begins while working the pins with the adjusted straightening amplitude.

It is noted that the controller 47 could perform all operations which have been described hereinabove for the controller and the computer 48 without departing from the spirit and scope of the invention. In that instance, the flow chart process of FIG. 8 would be contained within the ROM of the memory 58. Also, the output of the video measuring system 42 would be coupled directly to the controller 47 as indicated in dashed line in FIG. 3.

During the straightening operation in the "X" direction, the pin straightening assembly 29 is moved in a first direction by a predetermined distance from a starting point which represents the nominal or ideal centerline of each of the pins 21 being straightened. The assembly 29 is them moved in the reverse direction by a preselected distance from the starting point and then returns to the starting point. The assembly 29 is then reciprocated on this pattern during the straightening operation. For the purposes of discussion, the first direction is considered as the positive direction and the reverse direction is the negative direction. Consequently, the negative direction movement is the last movement which exerts a straightening force on the pins 21.

Prior to initiating the operation, a standard straightening amplitude is established within the pin straightening apparatus 23. The selection of the positive and negative direction settings for the standard amplitude were selected by using historical data. The pins 21 are then processed through a straightening operation using the standard straightening amplitude. Thereafter, the centroids of the sampling of pins 21 are measured to obtain the $\overline{X}$ and $\overline{Y}$ data. If a decision is made to process the pins 21 through a second straightening operation, the standard straightening amplitude is adjusted to bring the pins closer to nominal.

Since the negative "X" direction motion of the assembly 29 applies the last force to the pins 21, only the negative setting is adjusted while the positive setting remains constant. In order to determine the adjusted setting, the arithmetic value of $\overline{X}$ is added to the absolute value of the initial negative setting of the standard straightening amplitude. This summation provides the absolute value of the adjusted setting in the negative direction.

For example, the standard straightening amplitude of the preferred embodiment is 0.120 inch in the positive direction and 0.075 inch in the negative direction. If the value of $\overline{X}$ equals a positive 0.004 inch, this arithmetic value is summed arithmetically with the absolute value of the negative 0.075 inch setting to obtain a new or adjusted setting of 0.079 inch in the negative direction. If the value of $\overline{X}$ equals a negative 0.005 inch, this arithmetic value is summed arithmetically with the absolute value of the negative 0.075 inch setting to obtain a new or adjusted setting of 0.070 inch in the negative direction.

The same value settings of positive 0.120 inch and negative 0.075 inch are used for the "Y" direction. Adjustments to the "Y" direction straightening amplitude are calculated in the same manner.

By using the above-described format, a table can be prepared which will reveal directly the adjusted negative setting for given values of $\overline{X}$ and $\overline{Y}$. The data then provides the basis for the look-up table stored within the ROM of the memory 58. For example, with reference to the above-discussed examples, when the controller 47 is informed that $\overline{X}$ equals positive 0.004 inch, the information derived from the look-up table reveals that the new or adjusted setting in the negative direction is 0.079 inch. When the controller 47 is informed that $\overline{X}$ equals negative 0.005 inch, the information derived from the look-up table reveals that the new or adjusted setting in the negative direction is 0.070 inch.

What is claimed is:

1. A method of straightening pins supported in a backplane, which comprises the steps of:

establishing within a pin straightening apparatus a standard pin straightening amplitude between spaced values having opposite end limit settings selected from a scale of values which set the limits between which a pin straightening assembly travels within the apparatus;

developing a table of values which represent selectable adjustment settings for at least one of the end limit settings where the values of the table are based on (1) a range of mean deviations from nominal of a statistical sample of the pins and (2) the end limit setting;

processing the pins through a pin straightening operation using the standard pin straightening amplitude;

measuring the centroids of a statistical sample of the pins to obtain measured data representing pin deviation from nominal;

calculating a mean deviation from nominal by using the measured data;

reviewing the table of values and selecting therefrom an adjustment setting based on the calculated mean deviation;

automatically adjusting the straightening amplitude within the pin straightening apparatus in accordance with the selected adjustment setting; and processing the pins through another pin straightening operation using the adjusted pin straightening amplitude.

2. The method of straightening pins as set forth in claim 1, which further comprises the step of analyzing the mean deviation from nominal immediately after calculating the mean deviation to determine whether, on a statistical basis, the pins require processing through an additional pin straightening operation.

3. A method of straightening pins supported in a backplane, which comprises the steps of:

establishing within a pin straightening apparatus a standard pin straightening amplitude between spaced values having opposite end limit settings selected from a scale of values which set the limits between which a pin straightening assembly travels within the apparatus;

developing a table of values which represet selectable adjustment settings for at least one of the end limit settings where the values of the table are based on (1) a range of mean deviations from nominal of a statistical sample of the pins and (2) the end limit setting;

processing the pins through a pin straightening operation using the standard pin straightening amplitude;

measuring the centroids of a statistical sample of the pins to obtain measured data representing pin deviation from nominal;

calculating a mean deviation from nominal by using the measured data;

calculating a standard deviation of the pins by using the measured data;

summing the calculated mean divation and a multiple of the calculated standard deviation to obtain a factor representing a statistical net of pin deviation within which a major percentage of the pins will fall;

comparing the factor with an acceptable straightness tolerance limit;

determining whether another straightening operation is required based on the results of the comparison;

reviewing the table of values and selecting therefrom an adjustment setting based on the calculated mean deviation;

automatically adjusting the straightening amplitude within the pin straightening apparatus in accordance with the selected adjustment setting; and processing the pins through another pin straightening operation using the adjusted pin straightening amplitude.

4. A method of straightening pins supported in a backplane, which comprises the steps of:

establishing within a pin straightening apparatus a first standard pin straightening amplitude in a first pin straightening direction and a second standard pin straightening amplitude in a second pin straightening direction with each amplitude being between spaced values having opposite end limit settings selected from a scale of values which set the limits between which a pin straightening assembly travels in the first direction and the backplane travels in the second direction during a pin straightening operation;

developing a table of values which represent selectable adjustment settings for at least one of the end limit settings in each of the first and second directions where the values of the table are based on (1) a range, in each direction, of mean deviations from nominal of a statistical sample of the pins and (2) the end limit setting in each direction;

capturing the tips of the pins only within a first planar surface of a pin straightening assembly of the apparatus;

reciprocating the pin straightening assembly in a first plane to straighten the pins in the first direction;

capturing the tips of the pins only within a second planar surface of the pin straightening assembly which is recessed from the first planar surface in a direction away from the pins to be straightened;

reciprocating the backplane in a second plane to straighten the pins in the second direction;

measuring the centroids of a statistical sample of the pins to obtain measured data representing pin deviation from nominal in each direction;

calculating a mean deviation from nominal in each direction by using the measured data;

reviewing the table of values and selecting therefrom an adjustment setting for each direction based on the calculated mean deviation in each direction;

automatically adjusting the straightening amplitude in each direction within the pin straightening apparatus in accordance with the selected adjustment settings; and processing the pins through the above steps of capturing, reciprocating, capturing and reciprocating in a second straightening operation using the adjusted pin straightening amplitude in each direction.

5. The method of straightening pins as set forth in claim 4, which further comprises the step of rigidly clamping the backplane during the straightening of the pins.

6. The method of straightening pins as set forth in claim 4, which further comprises the step of holding the backplane flat during the straightening of the pins.

7. The method of straightening pins as set forth in claim 4, which further comprises the steps of:

rigidly lamping the backplane during the straightening of the pins; and holding the backplane flat during the straightening of the pins.

8. The method of straightening pins as set forth in claim 4, which further comprises the step of supporting the backplane in a position to expose the pins while the backplane and pins are located in the pin straightening apparatus except during the straightening of the pins.

9. A method of straightening pins supported in a backplane, which comprises the steps of:

establishing within a pin straightening apparatus a standard pin straightening amplitude between spaced values having opposite end limit settings selected from a scale of values which set the limits between which a pin straightening assembly travels within the apparatus;

processing the pins through a pin straightening operation using the standard pin straightening amplitude;

measuring the centroids of a statistical sample of the pins to obtain measured data representing pin deviation from nominal;

calculating a mean deviation from nominal by using the measured data; and analyzing the mean deviation from nominal immediately after calculating the mean deviation to determine whether, on a statistical basis, the pins require processing through an additional pin straightening operation.

* * * * *